US007958467B2

(12) United States Patent
Bowen

(10) Patent No.: US 7,958,467 B2
(45) Date of Patent: Jun. 7, 2011

(54) DETERMINISTIC SYSTEM AND METHOD FOR GENERATING WIRING LAYOUTS FOR INTEGRATED CIRCUITS

(75) Inventor: C. Trevor Bowen, Athens, AL (US)

(73) Assignee: Adtran, Inc., Huntsville, AL (US)

( * ) Notice: Subject to any disclaimer, the term of this patent is extended or adjusted under 35 U.S.C. 154(b) by 238 days.

(21) Appl. No.: 11/840,050

(22) Filed: Aug. 16, 2007

(65) Prior Publication Data

US 2007/0294656 A1 Dec. 20, 2007

Related U.S. Application Data

(63) Continuation-in-part of application No. 11/734,376, filed on Apr. 12, 2007.

(60) Provisional application No. 60/838,084, filed on Aug. 16, 2006, provisional application No. 60/815,028, filed on Jun. 20, 2006.

(51) Int. Cl.
*G06F 17/50* (2006.01)
(52) U.S. Cl. .................................................. 716/100
(58) Field of Classification Search ............. 716/11, 716/12, 100
See application file for complete search history.

(56) References Cited

U.S. PATENT DOCUMENTS

| | | | | |
|---|---|---|---|---|
| 5,550,748 A * | 8/1996 | Xiong | ............................. | 716/13 |
| 5,877,091 A * | 3/1999 | Kawakami | ................... | 438/737 |
| 5,963,975 A | 10/1999 | Boyle et al. | | |
| 6,009,248 A * | 12/1999 | Sato et al. | ......................... | 716/2 |
| 6,230,304 B1 * | 5/2001 | Groeneveld et al. | ............. | 716/7 |
| 6,542,834 B1 * | 4/2003 | Dixit | .............................. | 702/65 |
| 6,954,167 B2 | 10/2005 | Leung | | |
| 7,281,232 B1 * | 10/2007 | Nicolino et al. | ................ | 716/12 |
| 2006/0026547 A1 * | 2/2006 | Aggarwal | ....................... | 716/16 |
| 2006/0057840 A1 | 3/2006 | Kerr et al. | | |
| 2007/0212873 A1 * | 9/2007 | Kerr et al. | ..................... | 438/631 |
| 2007/0234246 A1 | 10/2007 | Sinha et al. | | |
| 2007/0288877 A1 * | 12/2007 | Matsuoka | ....................... | 716/11 |

OTHER PUBLICATIONS

Alan Hastings, "The Art of Analog Layout," by Prentince-Hall, Inc., pp. 231-257, 426-442, 2001.
Lopez, et al., "Layout-constrained Retargeting of Analog Blocks," Instituto de Microelectonica de Sevilla, Centro Nacional de Microelectonica Edif. CICA, Avda.
Hartono, et al., "Active Device Generation for Automatic Analog Layout Retargeting Tool," UWEE Technical Report No. UWEETR-2004-0015, May 13, 2004, pp. 1-36.
Bruce, et al., "Analog Layout Using ALAS!," IEEE Journal of Solid-State Circuits, vol. 31, No. 2, Feb. 1996, pp. 271-274, 1364-1365.

(Continued)

*Primary Examiner* — Jack Chiang
*Assistant Examiner* — Suchin Parihar
(74) *Attorney, Agent, or Firm* — Lanier Ford Shaver & Payne P.C.; Jon E. Holland

(57) ABSTRACT

The present disclosure generally pertains to automatic wiring systems and methods for generating wiring layouts for integrated circuits. In one exemplary embodiment, a wiring router ensures that the wiring for multiple device segments is matched. That is, the wiring router defines the wiring paths such that the same or substantially similar localized metal patterns exist around each of the device segments. Thus, when an integrated circuit (IC) chip is manufactured according to the wiring layout, the IC chip should be less susceptible to the effects of process variations.

26 Claims, 13 Drawing Sheets

OTHER PUBLICATIONS

Sayed, et al., "Automatic Generation of Common-Centroid Capacitor Arrays with Arbitrary Capacitor Ratio," Proceedings of the 2002 Design, Automation and Test in Europe Conference and Exhibition, IEEE, 2002.

Long, et al., "Optimal Two-Dimension Common Centroid Layout Generation for MOS Transistors Unit," Dept. of Computer Science and Technology, Tsinghua University, Beijing, China.

Baker, et al., "CMOS Circuit Design, Layout, and Simulation," IEEE Press Series on Microelectronic Systems, 1998, pp. 134-141, 446-449.

Bowen, U.S. Appl. No. 11/734,376, entitled, "System and Method for Designing a Common Centroid Layout for an Integrated Circuit," Filed Apr. 12, 2007.

* cited by examiner

DETERMINISTIC SYSTEM AND METHOD FOR GENERATING WIRING LAYOUTS FOR INTEGRATED CIRCUITS

CROSS REFERENCE TO RELATED APPLICATIONS

This application claims priority to U.S. Provisional Patent Application No. 60/838,084, entitled "A Systematic Method for Wiring Common-Centroid Cells," and filed on Aug. 16, 2006, which is incorporated herein by reference. This application is a continuation-in-part of and claims priority to U.S. patent application Ser. No. 11/734,376, entitled "System and Method for Designing a Common Centroid Layout for an Integrated Circuit," and filed on Apr. 12, 2007, which is incorporated herein by reference. U.S. patent application Ser. No. 11/734,376 claims priority to U.S. Provisional Patent Application No. 60/815,028, entitled "Automatic Generation of Common-Centroid Arrays," and filed on Jun. 20, 2006, which is incorporated herein by reference.

RELATED ART

An integrated circuit (IC) design may include many interconnected devices (e.g., transistors). It is often desirable for such devices to be subdivided into various segments and for the segments of the devices in a given circuit to be interspersed in an effort to reduce harmful effects caused by process variations during manufacturing. In this regard, the device segments of a circuit can be arranged such that all of the devices of the circuit have a common centroid. In such a case, effects from process variations across an IC chip tend to cancel thereby providing a more reliable and robust circuit. However, an IC chip can contain a large number of circuits, and ensuring that each circuit exhibits a common centroid can be difficult and problematic.

In addition, even if a circuit designer can generate a common centroid layout for the device segments, mismatches in the wiring used to connect the device segments can adversely affect tolerances. As known in the art, the wiring for multiple device segments is generally referred to as being "matched" when the same or substantially similar localized metal pattern exists around each of the device segments. Wiring mismatches can introduce, during manufacturing, mechanical stresses that affect the performance of the IC chip.

In an effort to achieve the best performance, many layout designers manually draw the wiring geometry, which is a very time consuming process. Due to the large number of device segments within a typical IC chip, other layout designers use an automatic wiring router to generate the wiring layout for an IC. An automatic wiring router defines the path for each wire that is used to connect one circuit element to another. Many conventional wiring routers employ highly iterative, trial-and-error techniques to generate the wiring layout for a circuit design. However, given the large number of circuit elements within a typical IC chip, the wiring topology for an IC is often complex. Although some automatic wiring routers attempt to "balance" certain wires by ensuring that they have the same length, many wiring routers make no attempt to ensure that wiring for the device segments is fully matched.

BRIEF DESCRIPTION OF THE DRAWINGS

The disclosure can be better understood with reference to the following drawings. The elements of the drawings are not necessarily to scale relative to each other, emphasis instead being placed upon clearly illustrating the principles of the disclosure. Furthermore, like reference numerals designate corresponding parts throughout the several views.

DETAILED DESCRIPTION

The present disclosure generally pertains to automatic wiring systems and methods for generating wiring layouts for integrated circuits. In one exemplary embodiment, a wiring router ensures that the wiring for multiple device segments is matched. That is, the wiring router defines the wiring paths such that the same or substantially similar localized metal pattern exists around each of the device segments.

Thus, when an integrated circuit (IC) chip is manufactured according to the wiring layout, the IC chip should be less susceptible to the effects of process variations.

Figure 1:
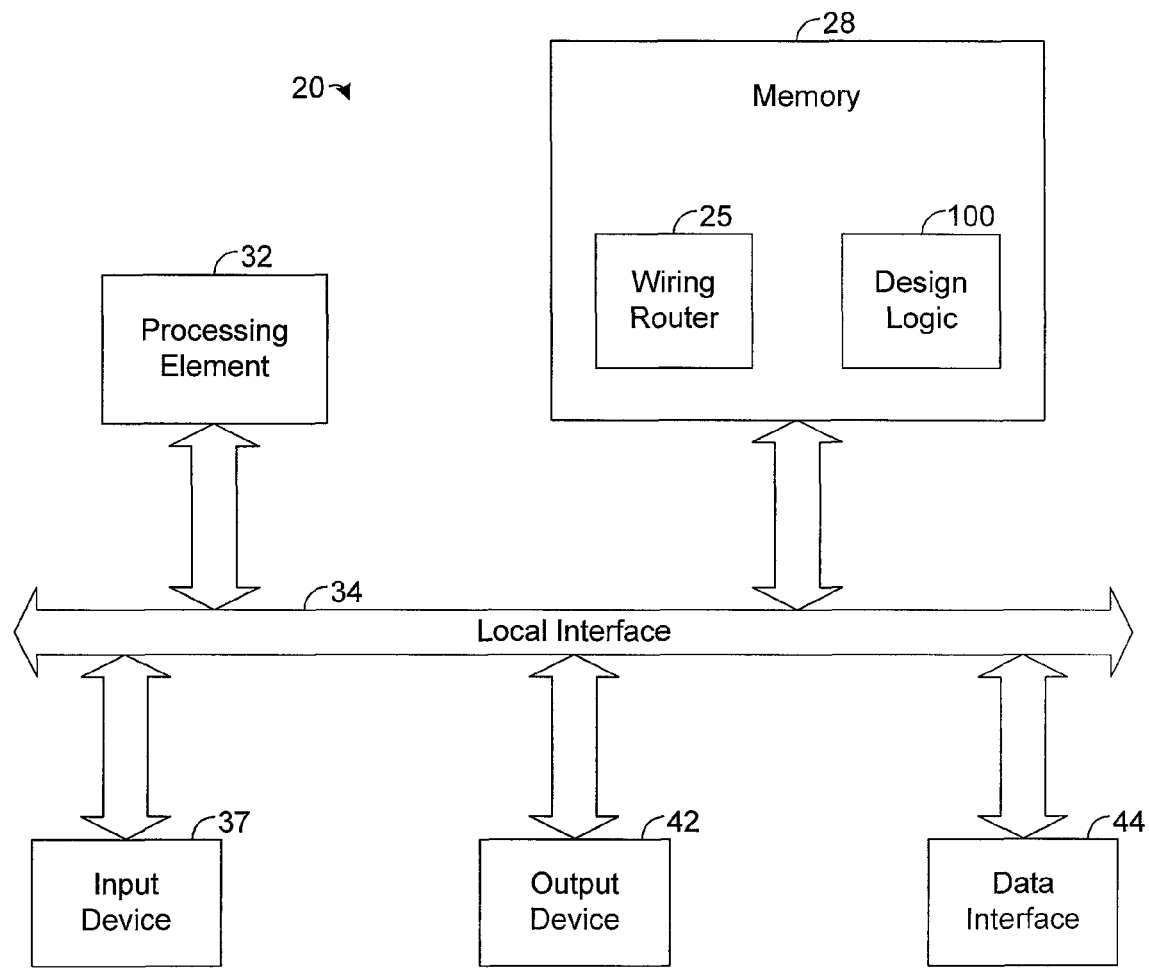
FIG. 1 is a block diagram illustrating an automatic wiring system in accordance with an exemplary embodiment of the present disclosure.

FIG. 1 depicts an automatic wiring system 20 in accordance with an exemplary embodiment of the present disclosure. As shown by FIG. 1, the system 20 comprises an automatic wiring router 25 that is configured to generate a wiring layout based on various input, such as will be described in more detail hereafter. It should be noted that the wiring router 25 can be implemented in software, hardware, or a combination thereof. In the exemplary embodiment illustrated in FIG. 1, the wiring router 25, along with its associated methodology, is implemented in software and stored in memory 28.

Note that the wiring router 25, when implemented in software, can be stored and transported on any computer-readable medium for use by or in connection with an instruction execution apparatus that can fetch and execute instructions. In the context of this document, a "computer-readable medium" can be any means that can contain or store a program for use by or in connection with an instruction execution apparatus.

The exemplary embodiment of the automatic wiring system 20 depicted by FIG. 1 comprises at least one conventional processing element 32, such as a digital signal processor (DSP) or a central processing unit (CPU), that communicates to and drives the other elements within the system 20 via a local interface 34, which can include at least one bus. Furthermore, an input device 37, for example, a keyboard or a mouse, can be used to input data from a user of the system 20, and an output device 42, for example, a printer or monitor, can be used to output data to the user. In addition, a data interface 44, such as a universal serial bus (USB) port, Ethernet port, or other type of interface, allows the system to exchange data with various external devices or systems, such as networks.

As will be described in more detail hereafter, the automatic wiring router 25 is configured to receive information about a circuit design and to generate a wiring layout for the circuit design based on such information. In one exemplary embodiment, the automatic wiring router 25 initially determines an electrical topology of a circuit being designed, as shown by block 46 of FIG. 2. In this regard, a user can enter, via input device 37 or otherwise, various information about the circuit. To facilitate this process, the automatic wiring router 25 may be configured to prompt the user for various information. Some exemplary information that may be entered includes, but is not limited to: (1) the type of circuit being designed (e.g., whether the circuit is a differential pair, current mirror, wide-swing cascode mirror, etc.); (2) whether any transistor gates should be connected to transistor drains; (3) whether any internal nodes should be made accessible as pins; (4) number of devices (e.g., transistors) in circuit; and (5) whether source connections can be tied to inner-guard ring. Moreover, based on the information provided by the user, the wiring router 25 is aware of what devices are included in the circuit being designed and how these devices are electrically connected to one another.

Figure 2:
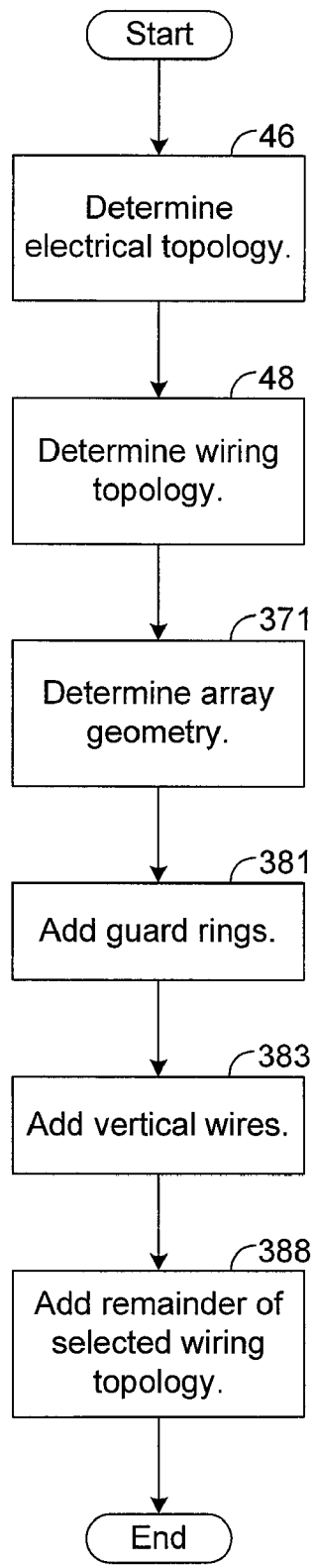
FIG. 2 is a flow chart illustrating an exemplary method for generating a wiring layout for an integrated circuit.

As shown by block 48 of FIG. 2, the wiring router 25 determines the wiring topology. In one exemplary embodiment, the wiring router 25 selects a desired wiring topology from three possible wiring topologies, which will be referred to respectively as "zero redundancy," "one-third redundancy," and "full redundancy." Before describing the foregoing wiring topologies, it may be helpful to first explain various aspects about the IC circuit design techniques described herein. In this regard, refer to FIG. 3, which depicts a top view of an exemplary segment layout for an exemplary circuit.

Figure 3:
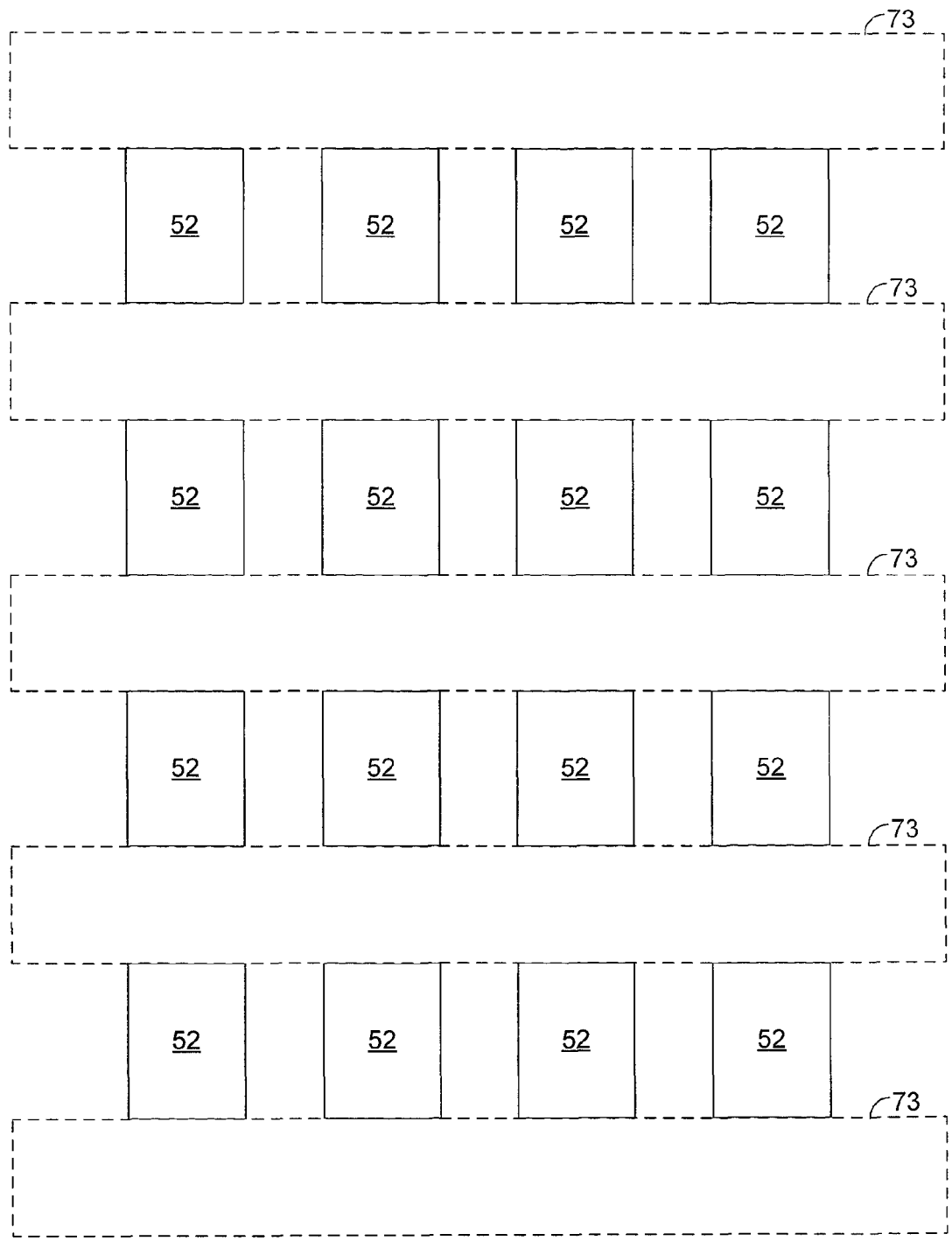
FIG. 3 depicts an exemplary segment layout.
Figure 4:
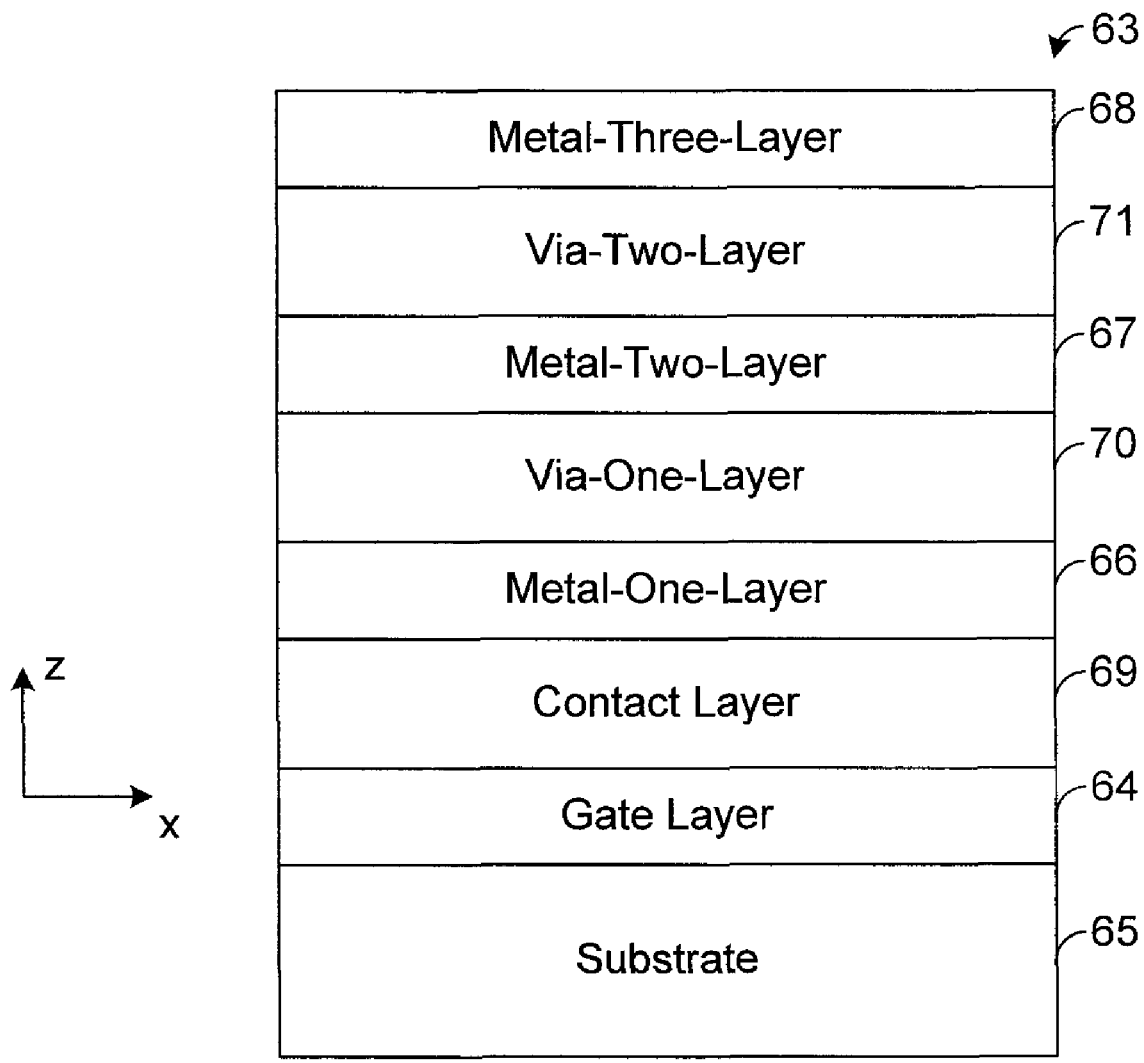
FIG. 4 depicts an exemplary layer stack for an integrated circuit (IC) chip.

In particular, FIG. 3 shows an array 51 of various device segments 52. The wiring router 25 may be used to route wires for the device segments 52. FIG. 4 depicts the layer stack for an exemplary IC chip 63 that may be manufactured according the segment layout of FIG. 3 and the wiring layout generated by the wiring router 25. During manufacturing, the device segments 52 may be formed on a substrate 65, using an insulated gate material, such as but not limited to polysilicon, thereby forming a layer 64, referred to hereafter as "gate layer." As shown by FIG. 4, the chip 63 has multiple layers 66-68 of conductive material forming wires for carrying signals. Hence, each layer 66-68 will be referred to hereafter as a "metal" layer. In particular, layer 66 will be referred to as the "metal-one-layer," layer 67 will be referred to as the "metal-two-layer," and layer 68 will be referred to as the "metal-three-layer."

As shown by FIG. 4, a layer 69, referred to hereafter as "contact layer," is formed between the gate layer 64 and the metal-one-layer 66. In addition, a layer 70, referred to as "via-one-layer," is formed between the metal-one-layer 66 and the metal-two-layer 67, and a layer 71, referred to as "via-two-layer," is formed between the metal-two-layer 67 and the metal-three-layer 68. Each of the via layers 70, 71 are composed of electrically insulating material with conductive paths, referred to as "vias" formed in the insulating material to provide electrical connectivity between the wires on top of the via layer 70, 71 to the wires on bottom of the via layer 70, 71. Further, like the via layers 70, 71 that provide electrical connectivity to wires above and below the layers 70, 71, the contact layer 69 provides electrical connectivity between the wires of the metal-one-layer 66 and the segments 52 of the gate layer 64. Each of the layers 64, 66-71 is formed via conventional microfabrication techniques in successive order, each on top of the other, beginning with the lowest layer 64, which is formed on top of the substrate 65.

Moreover, the wires formed by the metal-one-layer 66 will be referred to as "metal-one-wires." Such wires are electrically connected to the segments 52 (FIG. 3) by conductive contacts (not specifically shown) formed by the contact layer 69. Similar to the aforementioned vias that extend through electrically insulating material, each gate contact may extend through electrically insulating material from a respective segment 52 to a respective metal-one-wire. The wires formed by the metal-two-layer 67 will be referred to as "metal-two-wires," and the metal-two-wires are electrically connected to the metal-one-wires by conductive vias (not specifically shown) formed by the via-one-layer 70. The wires formed by the metal-three-layer 68 will be referred to as "metal-three-wires," and the metal-three-wires are electrically connected to the metal-two-wires by conductive vias (not specifically shown) formed by the via-two-layer 71. The paths of each wire formed by the layers 66-68 are specified by the wiring router 25 according to techniques described herein, and the wiring router 25 also specifies the location of the vias in layers 66-68 that interconnect the wires and segments 52.

Figure 5:
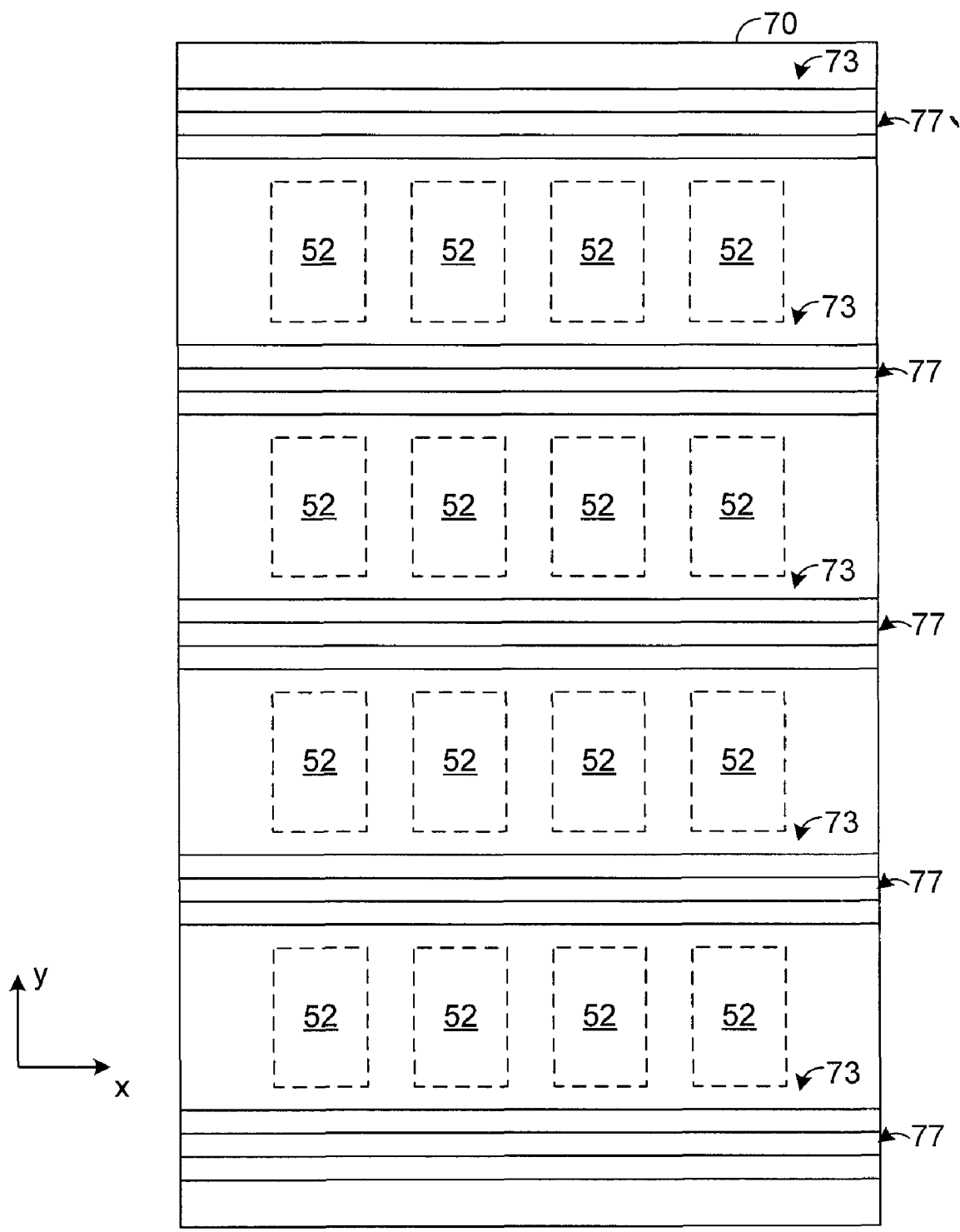
FIG. 5 depicts a top view of a metal-two-layer, such as is depicted by FIG. 4, for an exemplary IC sub-circuit.

Referring to FIG. 3, regions 73 adjacent to the segments 52 will be referred to herein as "horizontal wiring bays." Except for the outermost horizontal wiring bays 73 at the top and the bottom of the array 51, each horizontal wiring bay 73 is between adjacent rows of segments 52 and extends from one of the adjacent rows of segments 52 to the other. The metal-two-wires of the metal-two-layer 67 are positioned within a perimeter of the horizontal wiring bays 73. For example, FIG. 5 shows exemplary sets 77 of metal-two-wires. Further, all of the wires in each set 77 extend in the x-direction and are, therefore, parallel. In the embodiment depicted by FIG. 5, each wire set 77 has four wires. In other embodiments, each set 77 may have other numbers of wires and may extend in different directions across the metal-two-layer 67. However, it is generally desirable for each set 77 to have the same number of wires and to have the same directional pattern in an effort to prevent wiring mismatches among the segments 52. In this regard, as described above, it is generally desirable for each of the segments 52 to be surrounded by the same or substantially similar localized wiring pattern. In FIG. 5, there are four wires with the same directional pattern (i.e., extending in the x-direction) between each row of segments 52. Thus, there are no wiring mismatches created by the sets 77 shown in FIG. 5. In other embodiments, it is possible for the directional patterns of some of the metal-two-wires to vary with respect to the directional patterns of other metal-two-wires. In such a case, it is generally desirable for such variations to be symmetrical such that the same localized wiring pattern exists around each segment 52.

Figure 6:
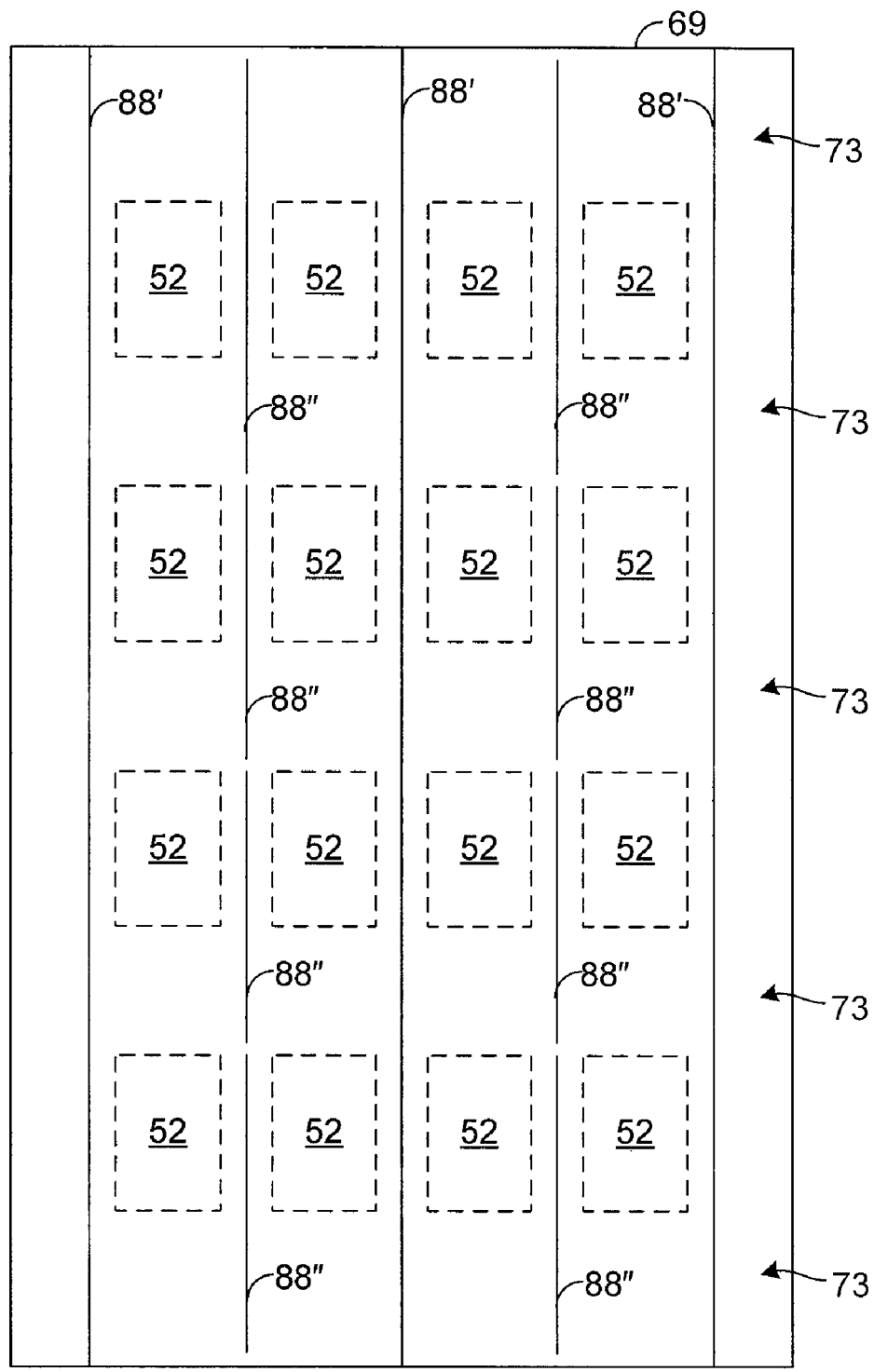
FIG. 6 depicts a top view of a metal-one-layer, such as is depicted by FIG. 4, for an exemplary IC sub-circuit.

FIG. 6 shows exemplary metal-one-wires 88', 88" of the metal-one-layer 66. The metal-one-wires 88', 88" can be connected to the segments 52 by contacts (not shown) between the gate layer 64 and the metal-one-layer 66, and the metal-one-wires can be connected to the metal-two-wires by vias (not shown) between the metal-one-layer 66 and the metal-two-layer 67. Thus, signals from the segments 52 can be carried by the metal-one-wires 88', 88" to the metal-two-wires. Each metal-one-wire 88', 88" may have the same directional pattern in an effort to avoid wiring mismatches. In other embodiments, it is possible for the directional patterns of some of the metal-one-wires 88', 88" to vary with respect to the directional patterns of other metal-one-wires 88', 88". In such a case, it is generally desirable for such variations to be matched such that the same localized wiring pattern exists around each segment 52. For example, in the embodiment shown by FIG. 6, the metal-one-wires include long wires 88' that pass through all of the horizontal wiring bays 73 and short wires 88" that pass into only one respective horizontal wiring bay 73. However, the long and short wires 88', 88" are positioned in an alternating fashion in the x-direction such that each segment 52 has a long wire 88' on one side and a short wire 88" on the other. Furthermore, the short metal-one-wires 88" are extended to help them resemble the long wires 88' as much as possible. Thus, the localized wiring pattern is the same for each segment 52 even though there are variations in the lengths for some of the metal-one-wires 88', 88".

Figure 7:
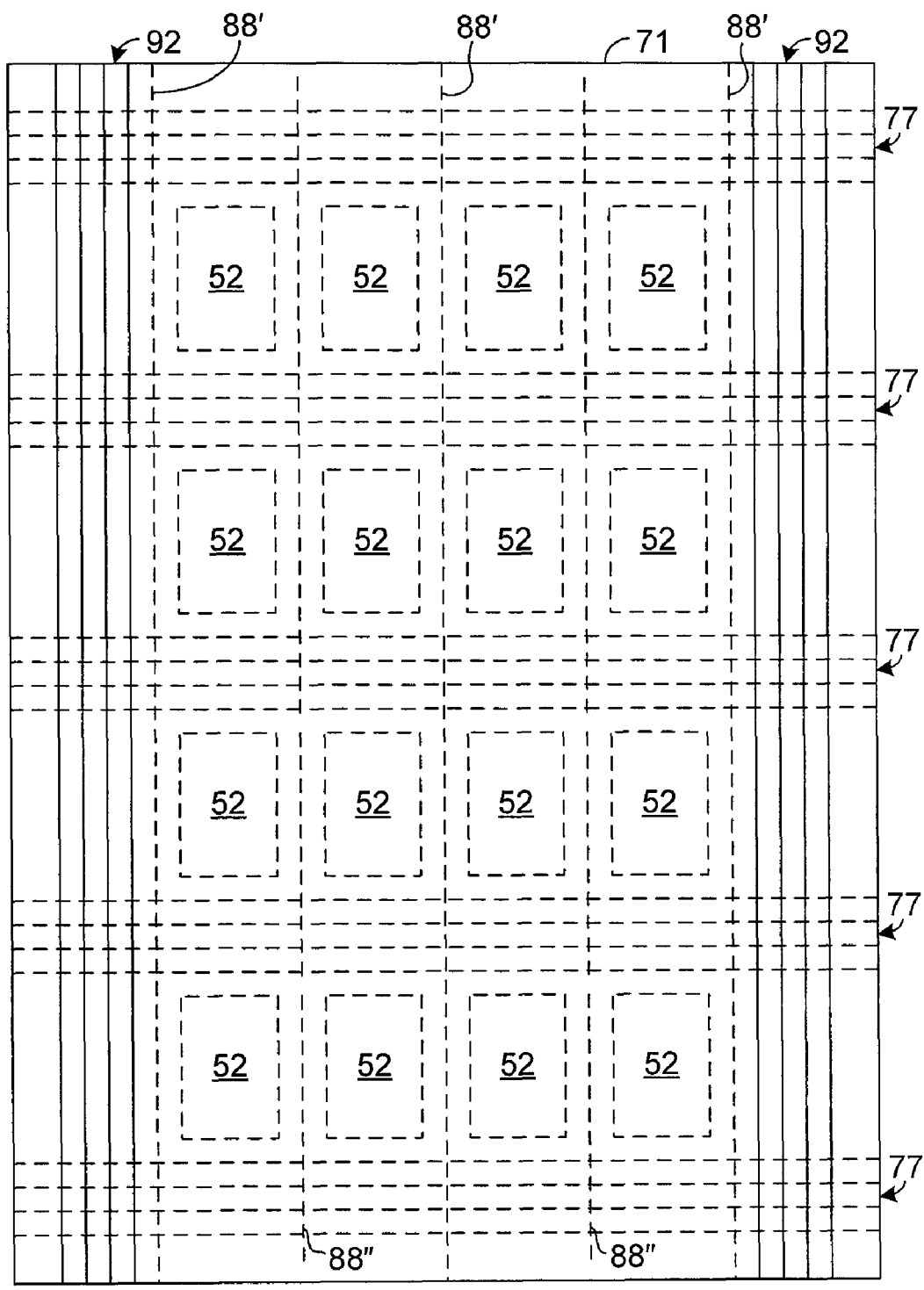
FIG. 7 depicts a top view of a metal-three-layer, such as is depicted by FIG. 4, for an exemplary IC sub-circuit.

FIG. 7 shows exemplary sets 92 of metal-three-wires. The exemplary embodiment shown in FIG. 7 has two sets 92, but other embodiments may have other numbers of metal-three sets 92. Each of the exemplary sets 92 of metal-three-wires has the same number of wires and same directional pattern in an effort to avoid wiring mismatches. In other embodiments, it is possible to use the metal-one-layer 66 for these wires instead of metal-three-layer 68 to minimize blocking of wiring channels; however, for the purpose of this disclosure, these wires will continue to be referred to as metal-three-wires, even though the metal-one-layer 66 could have been used instead. Furthermore, in other embodiments, it is possible for the directional patterns of some of the metal-three-wires to vary with respect to the directional patterns of other metal-three-wires. In such a case, it is generally desirable for such variations to be symmetrical such that the same localized wiring pattern exists around each segment 52.

Further, in the embodiment shown by FIG. 7, each set 92 is located on an opposite side of the array 51 of segments 52. Other positions of the metal-three-wires are possible in other embodiments. The metal-three-wires pass over the sets 77 of metal-two-wires and can be connected to these wires by vias (not shown) between the metal-three-layer 68 and metal-two-layer 67. Thus, signals from the segments 52 can be carried to the metal-two-wires by the metal-one-wires and then from the metal-two-wires to the metal-three wires. The metal-three-wires of FIG. 7 are located outside of the array 51, and various components, such as pins of the IC chip and/or other circuits formed on the IC chip can be connected to the metal-three-wires. In other embodiments, the metal-three-wires may be optionally eliminated all together, enabling the layout designer to directly connect the metal-two-wires to external components.

In the embodiment shown by FIGS. 5-7, none of the wires pass over the segments 52. In this regard, the metal-two-wires are within the horizontal wiring bays 73 between segments 52, and the metal-one-wires are positioned over regions between the segments 52. Thus, no wires are located directly over any of the segments 52. Such geometry has been selected for the exemplary embodiment to help minimize process variations induced by the metal geometry's direct influence over the gate and, therefore, to help avoid wiring mismatches. In other embodiments, it is possible for some wires to pass over the segments 52, but it is generally desirable to avoid this practice in an effort to minimize wiring mismatches.

As used herein, a wire is "associated" with a signal when it is capable of or reserved for carrying that signal. Thus, a wire connected to a drain of a particular transistor is referred to as being "associated" with a drain signal of that transistor.

Figure 8:
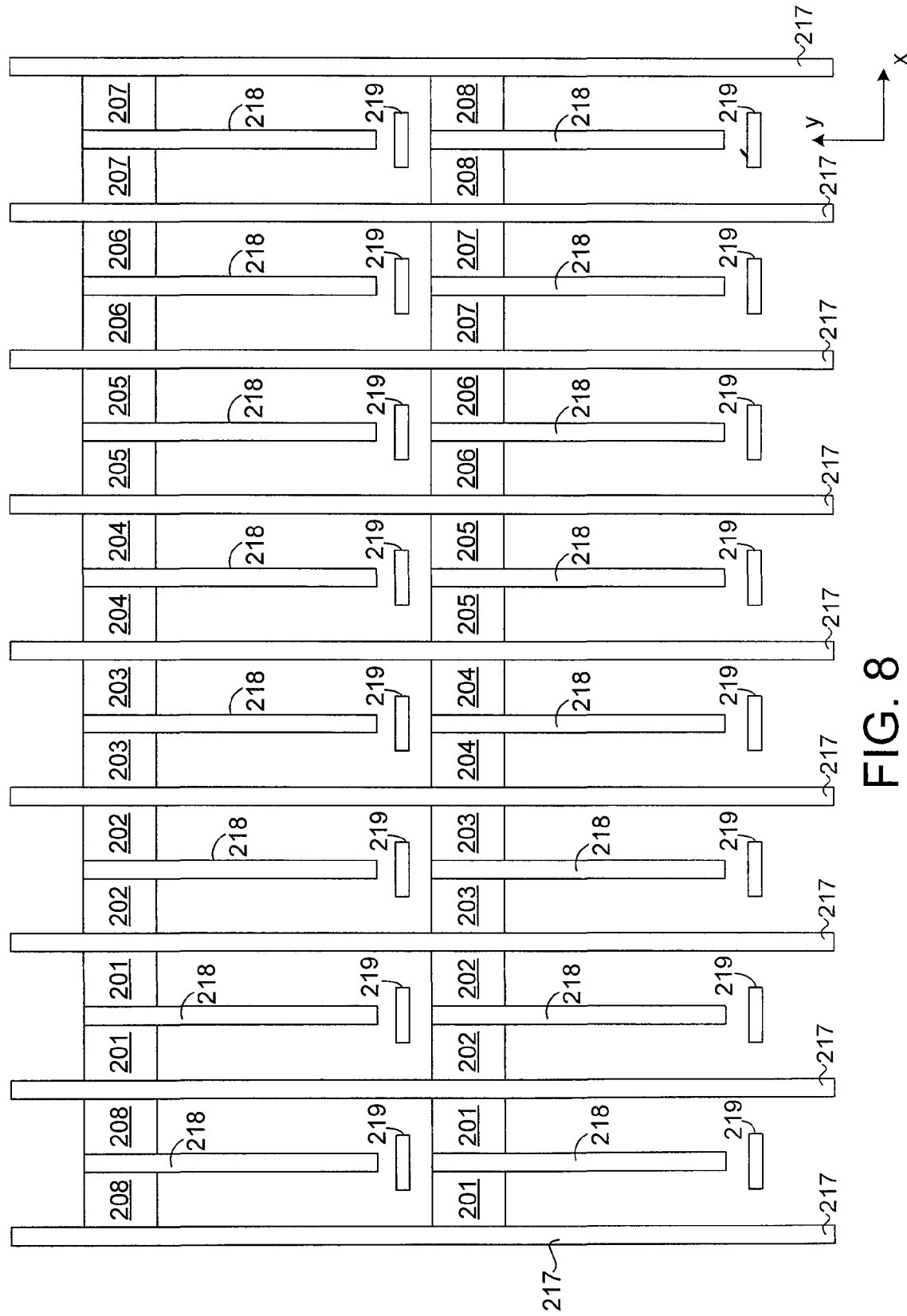
FIG. 8 illustrates an exemplary wiring layout for two rows of an exemplary segment layout showing metal-one-wires.

In a full redundancy topology, a metal-two-wire is included and associated with each signal for every horizontal wiring bay 73. Since each signal is repeated in each wiring bay, this particular wiring topology is labeled as "full redundancy". For example, refer to FIG. 8, which depicts exemplary segments and metal-one-wires for a current mirror embodiment. In particular, FIG. 8 depicts two rows of segments 201-208 that are formed on the substrate 63. Only two rows are shown for simplicity, but the current mirror may have more rows similarly configured. Each segment having the same reference numeral in FIG. 8 is part of the same device (e.g., transistor). Further, the segments 201-208 are actually formed on a different layer as compared to the metal-one-wires.

The source terminal of each segment 201-208 in FIG. 8 is electrically connected, by a respective contact (not specifically shown in FIG. 8) of the contact layer 69, to a respective metal-one-wire 217 associated with a source signal. Further, each segment in the same column is connected to the same wire 217, which extends all of the way through the array in this embodiment. In a current mirror, all of the sources are tied together. Thus, rather than including a separate wire 217 in each horizontal wiring bay, the wires 217 can be vertically arranged as shown in FIG. 8 thereby reducing the overall height (in the y-direction) of the array. If desired, the wires 217 may be tied together outside of the array. In other embodiments, the metal-one-wire associated with the source may extend into the horizontal wiring bay only as far as the other metal-one-wires. In such a case, an additional metal-two-wire may be included in every horizontal wiring bay to connect the metal-one-wires to the metal-three-wires, just like the routing of the other signals.

The drain terminal of each segment 201-208 is also connected, by a respective contact (not specifically shown in FIG. 8) of the contact layer 69, to a respective metal-one-wire 218 associated with a drain signal. Pairs of segments of the same device are connected to the same wire 218, which is shown as positioned between such segments in the x-direction. For example, the first two segments in the bottom row shown in FIG. 8 have the same reference numeral (i.e., 201) and are, therefore, part of the same device. Each of these segments 201 is connected to the wire 218 that is shown as being between the two segments 201 in the x-direction, although such wire 218 and the segments 201 are actually formed on different layers.

In this embodiment, each segment 201-208 is also connected to a respective metal-one-wire 219, referred to as a "gate bridge." Adjacent segments of the same device are connected to the same gate bridge 219, which is adjacent to such segments. For example, the first two segments 201 in the bottom row described above are each connected to the bridge 219 that is shown as positioned just above such segments 219 in the y-direction. Note that the vias connecting the segments 201-208 to the metal-one-wires are not shown in FIG. 8 for simplicity. Also not shown in FIG. 8 are connections that extend in the gate layer 64 from a device segment to the segment's respective bridge 219. In other embodiments, each gate segment may have its own independent gate layer to metal-one to metal-two connection, or connections may be shared by more than two segments.

Figure 9:
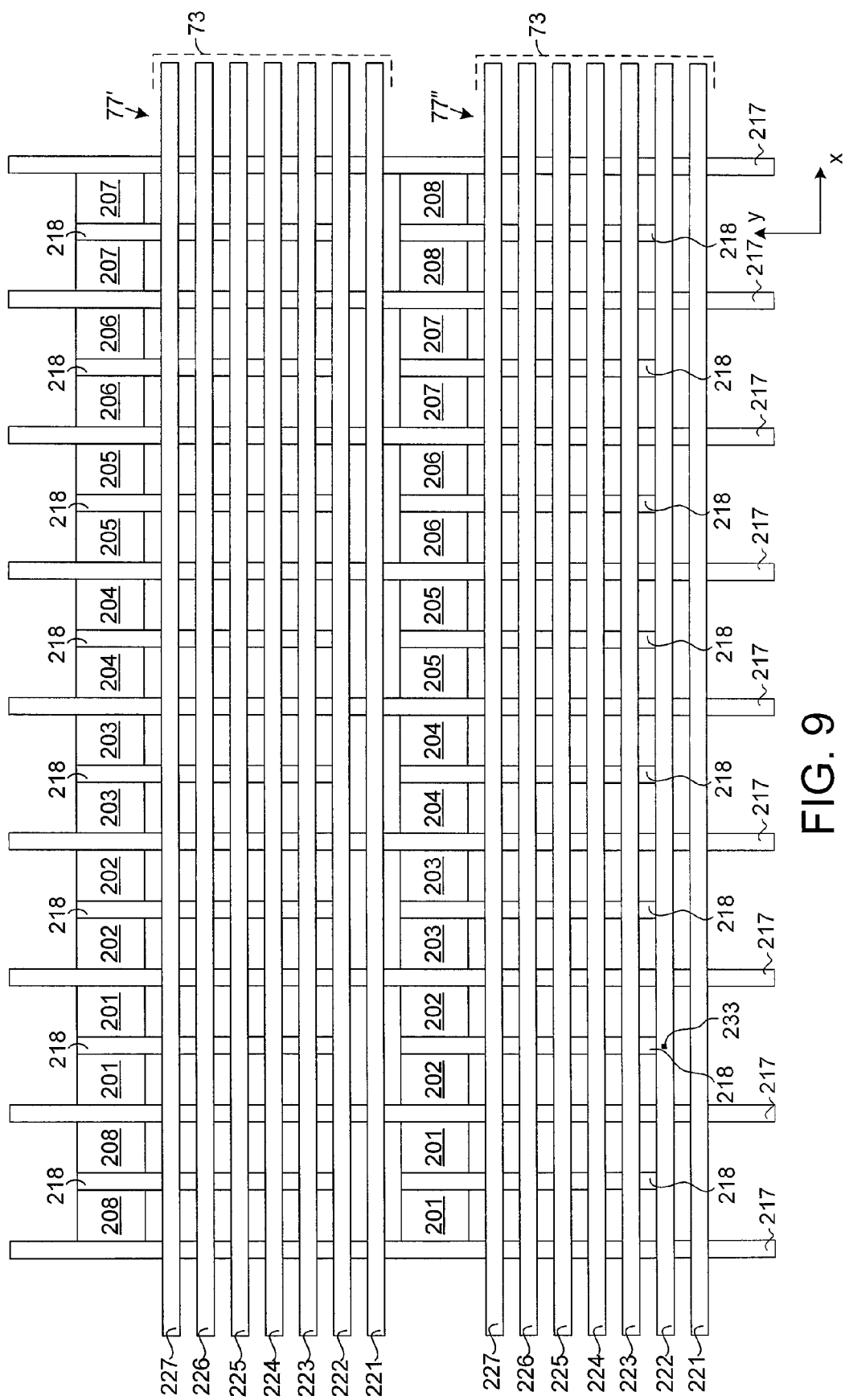
FIG. 9 illustrates an exemplary full redundancy wiring layout for two rows of an exemplary segment layout showing metal-one-wires and metal-two-wires.

FIG. 9 shows exemplary sets 77', 77" of metal-two-wires 221-227 for the current mirror portion shown in FIG. 8. FIG. 9 also shows the metal-one-wires 217, 218 shown by FIG. 8. As described above, the metal-two-wires 217, 218 are formed on a different layer relative to the metal-two-wires 221-227.

Referring to FIG. 9, each wire set 77', 77" within the same horizontal bay 73 has the same number of metal-two-wires 221-227. Further, each wire set 77', 77" is associated with the same signals. In this regard, wire 221 is associated with the drain signal from segments 201, and wire 222 is associated with the drain signal from segments 202. Further, wire 223 is associated with the drain signal from segments 203, and wire 224 is associated with the drain signal from segments 204. In addition, wire 225 is associated with the drain signal from segments 205, and wire 226 is associated with the drain signal from segments 206. Also, wire 227 is associated with the drain signal from segments 207. Moreover, the drain signal from any segment 201-208 can be conducted out of the array by forming a via (not shown) between the associated wires 218 and 221-227. For example, by forming a via (not shown) at point 233 between the metal-one-layer 66 and the metal-two-layer 67, the via connects the wire 222 with the underlying wire 218. Thus, a drain signal is transmitted from a segment 202 through the foregoing via and wires 218, 222 out of the array perimeter. To enable any of the drain signals from any of the segments 201-208 within the same row to be brought out of the array perimeter, each wire set 77', 77" includes a wire for each possible drain signal. Thus, each horizontal wiring bay 73 includes at least seven wires 221-227 in the current example. Note that, in a current mirror, the drain of one transistor, called the "reference", is typically connected to the gates of each transistor. Therefore, the same wire can be associated with the drain signal of the reference transistor and the gate signals of all transistors. Accordingly, in any given horizontal wiring bay 73, a single metal-two-wire 221 may be used for the foregoing drain signal and the gate signals.

Figure 10:
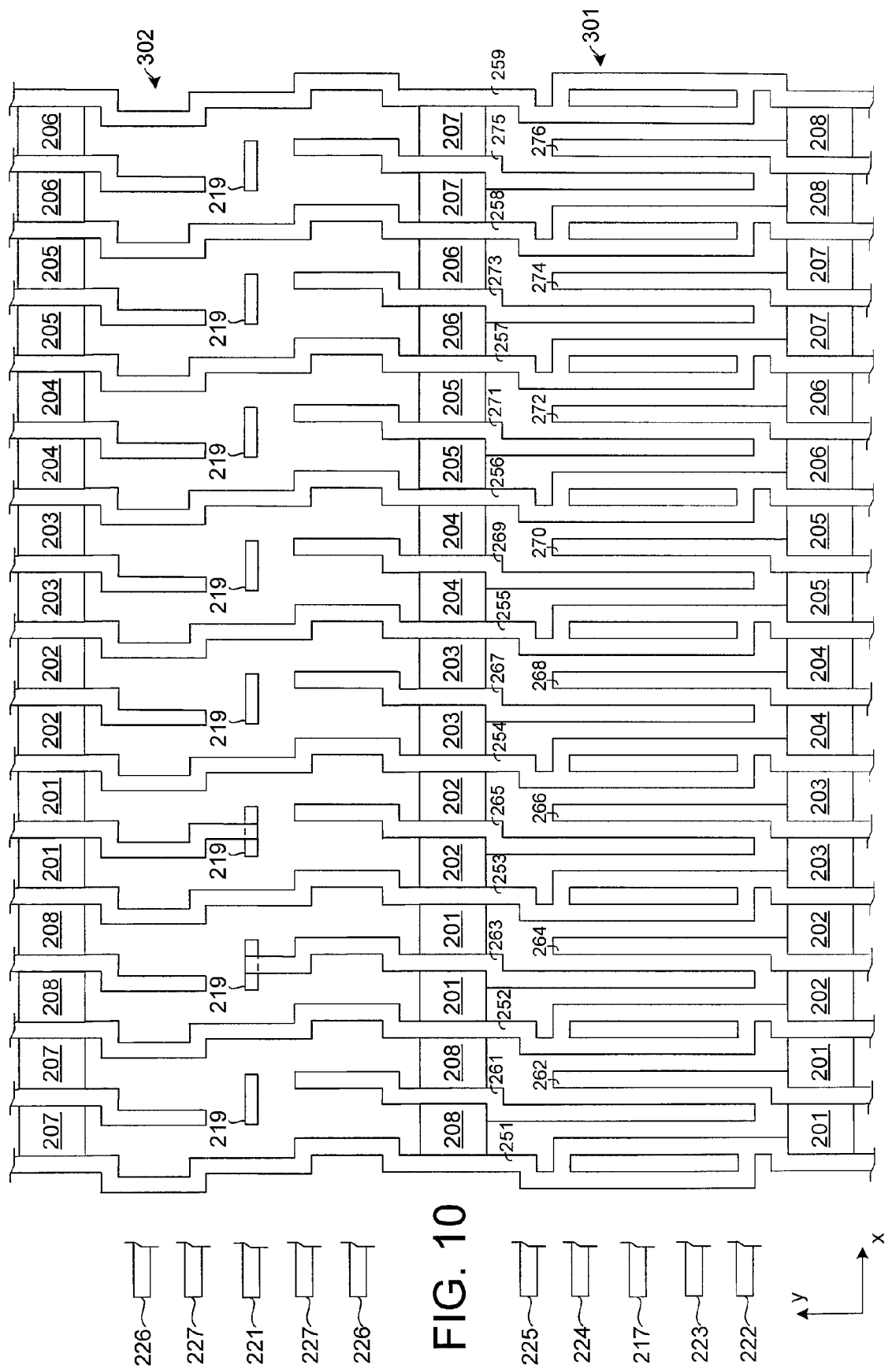
FIG. 10 illustrates an exemplary one-third redundancy wiring layout for two rows of an exemplary segment layout showing metal-one-wires.

Depending on the segment sizes, it is possible reduce the redundancy of the metal-two-wires in each horizontal wiring bay 73 in order to reduce the height and, therefore, footprint of the array. For example, if the gate length of the segments is great enough, it is possible to turn or jog the metal-one-wires so that metal-one-wires from multiple segment rows at the same x-position may pass each other without interfering with signals on such wires. As a mere example, refer to FIG. 10. A plurality of metal-one-wires 251-259 are each associated with source signals, and a plurality of metal-one-wires 261-276 are associated with drain signals. There is sufficient room such that opposing metal-one-wires 261-276 may be turned or jogged to pass each other without interfering with signals on such wires 261-276. For example, wire 261 is connected to the shared drain terminal of segments 208 in the middle row shown by FIG. 10, and wire 261 opposes wire 262, which is connected to the shared drain terminal of segments 201 in the bottom row shown by FIG. 10. However, in the illustrated horizontal wiring bay 301, the wires 261, 262 are jogged in opposite x-directions so that these wires 261, 262 are separated in such wiring bay 301 despite overlapping in the y-direction. Further, the separation is sufficient such that wire 261 does not violate a process-dependent minimum space rule with regard to wire 262. Since the horizontal wiring bay 301 can accommodate metal-one-wires extending from the segment rows above and below the wiring bay, unlike the same horizontal wiring bays of FIG. 9, it is possible to reduce the number of metal-two-wires in each bay. For example, as shown by FIG. 10, it is possible for one bay 301 to have metal-two-wires 222-225, 217 respectively associated with drain signals from segments 202-205 and the source signal. The next bay 302 would then have metal-two-wires 221, 226, 227 associated with drain signals from segments 201, 206, and 227, respectively. However, if the segment size is not great enough to support the opposing metal-one jogs and an independent gate contact, then the metal-one one jogs cannot pass the gate contact, and the metal-two wires may be repeated on either of side of the gate contacts. In such an example, the overall number of metal-two-wires is reduced, and such a wiring topology is referred to as a one-third redundancy wiring topology, since approximately one-third of all signals are repeated on both sides of the gate contact in the horizontal wiring bays containing gate contacts. Note that metal-two-wires of the same reference numeral are associated with the same signal.

Figure 11:
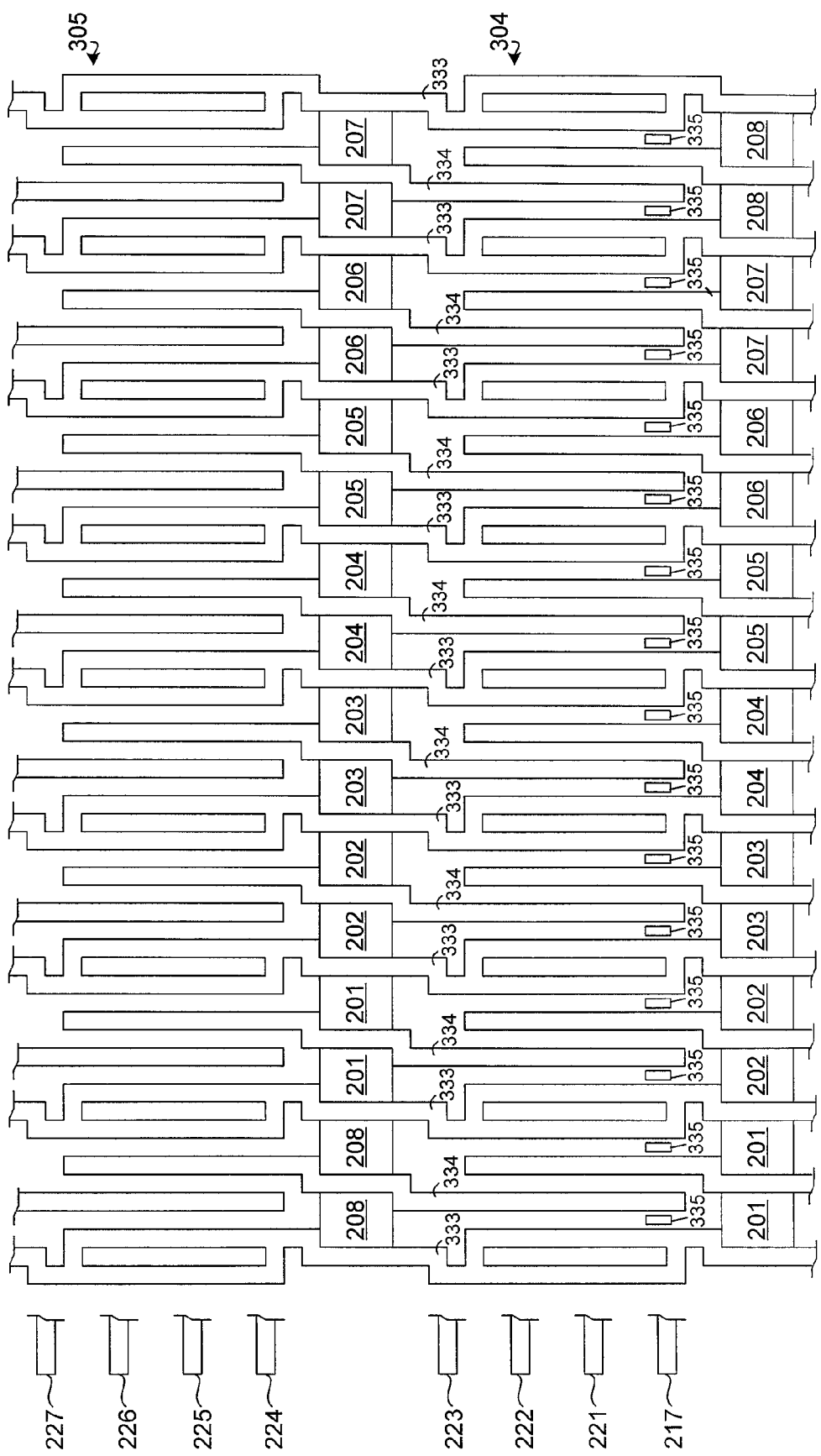
FIG. 11 illustrates an exemplary zero redundancy wiring layout for two rows of an exemplary segment layout showing metal-one-wires.

If the gate length is sufficiently large to fit, within the same horizontal wiring bay, three metal-one-wires respectively associated with the source, gate, and drain signals from the same segment, then even further wiring efficiencies can be realized. FIG. 11 depicts such an example. In this regard, the horizontal wiring bay 304 shown by FIG. 11, for each segment in a row of segments, has a metal-one-wire 333 that can carry the segment's source signal, a metal-one-wire 334 that can carry the segment's drain signal, and a gate contact 335 that can carry the segment's gate signal. Accordingly, there is no need for any of the segments in this same array row to reach a metal-two-wire through the other adjacent horizontal wiring bay 305. Therefore, for any given signal, it is sufficient if every other bay has a metal-two-wire associated with such signal. An embodiment in which the pattern of metal-two-wires repeats every other bay, as is the case for the embodiment shown by FIG. 11, is referred to herein as a zero redundancy wiring topology.

Note that other types of wiring topologies are possible in other embodiments. In addition, it should be noted that the exemplary zero redundancy and one-third redundancy topologies can help to optimize the design by reducing the footprint of the overall array, but optimizing the wiring topology is unnecessary. For example, it is possible to use the full redundancy wiring topology in each case thereby obviating the step of selecting a wiring topology. Further, topologies other than the full redundancy, one-third redundancy, and zero redundancy described herein are possible. In addition, various examples described herein have three metal layers, but any number of metal layers greater than 1 may be employed in other examples.

Moreover, in the instant example, the router 25 selects the desired wiring topology based on various inputs, such as the gate length, number of devices, device sizes, and number of desired rows and/or columns. Such information is preferably entered by a user and may also be used to generate the segment layout as will be described in more detail hereafter. Using such information, the router 25 can calculate the size of the array for each possible wiring topology and then select the wiring topology that provides the smallest footprint. Other techniques for selecting a desirable wiring topology are possible.

It should be noted that the available wiring topologies are preferably predefined based on the type of object being designed. For example, if the object is a current mirror, then the wiring patterns shown by FIGS. 6-11 may be defined by data stored in memory. The router 25 may then apply the predefined pattern of the selected wiring topology to the segment array being designed adjusting parameters, such as the number of wires, to be consistent with the number of segments and the dimensions of the wires to be consistent with the size of the segments. For example, the number of metal-two-wires (or other types of wires) in the horizontal wiring bays (or other areas) may be increased or decreased depending on the number of segments in the segment array. Moreover, instead of the wiring layout being generated via trial-and-error, the generation of the wiring layout is non-iterative in that it is successfully accomplished in a single pass. Indeed, the wiring algorithm is deterministic in that if the same input is provided to the router 25 for multiple runs, then the wiring layout generated by the router 25 would be the same for all runs.

As shown by block 371 of FIG. 2, the wiring router 25 determines the array geometry. In this regard, the router 25 determines the arrangement of device segments 52 within the circuit being designed. In one exemplary embodiment, information indicative of the arrangement of the device segments 52 is provided by design logic 100 (FIG. 1), which is configured to generate an arrangement of the device segments 52. Techniques for generating an arrangement of device segments 52 are generally well-known. In one exemplary embodiment, the design logic 100 is configured to generate an arrangement so that the devices defined by the device segments have a common centroid. In other words, the design logic 100 is configured to generate a common centroid arrangement for the device segments 52. U.S. patent application Ser. No. 11/734,376, entitled "System and Method for Designing a Common Centroid Layout for an Integrated Circuit," and filed on Apr. 12, 2007, which is incorporated herein by reference, describes exemplary techniques that may be used by the design logic 100 to generate a common centroid arrangement. In one exemplary embodiment described by the foregoing patent application, a common centroid arrangement is generated by defining a common centroid unit and then tiling the common centroid unit in a particular manner depending on various parameters of the desired arrangement. The generated arrangement may then be realized as a layout array of transistor segments using methods that are well known in the art, if desired.

Figure 12:
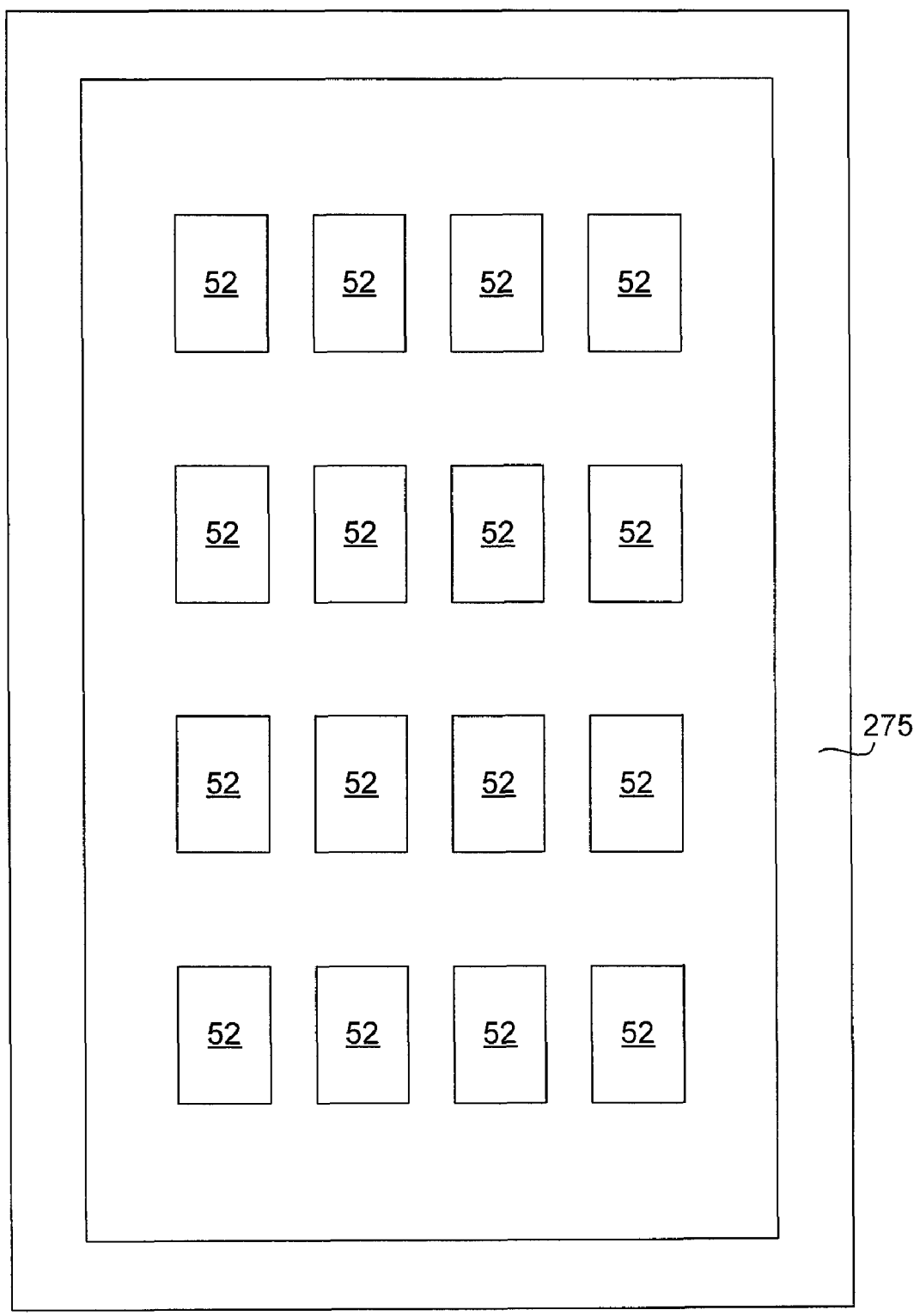
FIG. 12 illustrates an exemplary segment layout with guard rings added.

As shown by block 381 of FIG. 2, the wiring router 25 adds guard rings to the segment layout. As known in the art, guard rings are electrical taps that enclose an electrical structure to provide isolation from noise as well as biasing. For critical circuits, the array may be enclosed by multiple guard rings. FIG. 12 depicts an exemplary guard ring 275 enclosing an array of segments 52.

As shown by block 383 of FIG. 2, the wiring router 25 adds to the segment layout vertical wires of the wiring topology selected in block 48 that extend across the entire array. Such vertical wires may include, for example, metal-three-wires, such as those depicted in FIG. 7, and metal-one-wires, such as the metal-one-wires 217 carrying common source signals in FIG. 8.

Figure 13:
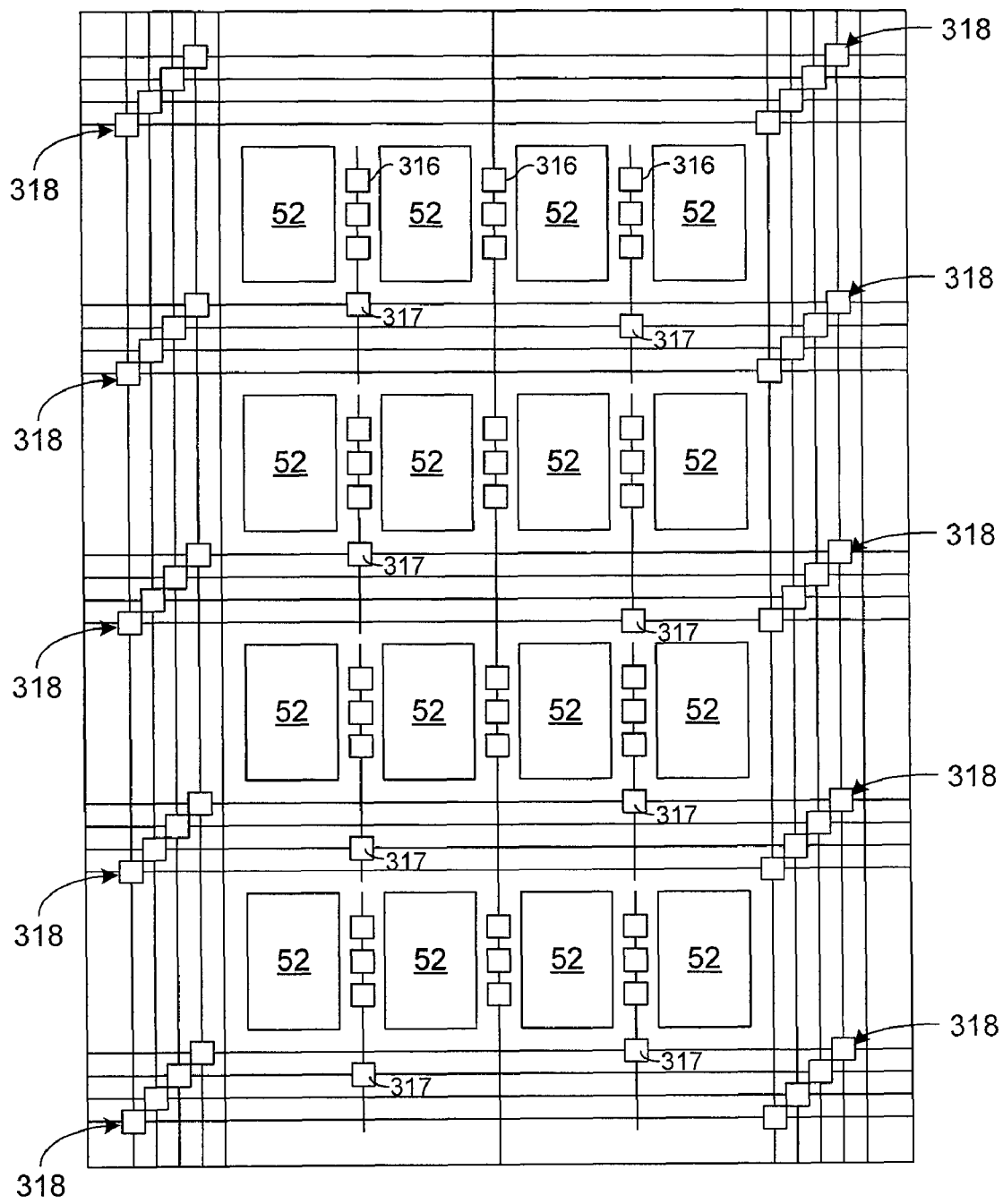
FIG. 13 illustrates an exemplary display of a wiring layout generated by an automatic wiring system, such as is depicted in FIG. 1.

As shown by block 388 of FIG. 2, the wiring router 25 adds the remainder of the wiring topology, which was selected in block 48 of FIG. 2. In this embodiment, the wiring router 25 steps through each row in the array and adds the metal-two-wires and metal-one-wires, as well as the vias. Other embodiments may iterate over the array's columns rather than its rows. The wiring router 25 also adds gate contacts and any other wiring that is part of the selected wiring topology. Accordingly, the router 25 creates a complete circuit layout that includes a segment layout generated by logic 100 combined with the wiring layout generated by the router 25. If desired, the router 25 may display the circuit layout or a portion of the circuit layout via output device 42. Such display may define an image of the segments and circuitry, as well as indicate the relative positions of each. For example, FIG. 13 shows an exemplary display of an exemplary circuit layout for the portion depicted in FIG. 7. FIG. 13 shows vias 316 connecting the transistor terminals in the substrate 65 to the metal-one-layer 66, vias 317 connecting the metal-one-layer 66 to the metal-two-layer 67, and vias 318 connecting the metal-two-layer 67 to the metal-three-layer 68. For simplicity of illustration, FIG. 13 does not show the gate contacts of the gate layer 69. Note that the display may be color coded. For example, the metal-one-wires may be colored a first color, the metal-two-wires may be colored a second color, and the metal-three-wires may be colored a third color. In addition, vias 316-318 may be coded different colors so that a user can determine in which layer a displayed via is located by its color.

As described above, wiring topologies that do not create significant wiring mismatches may be predefined, and data defining such topologies may be stored in memory. Thereafter, the wiring router 25 may select a desired wiring topology based on the type of circuit being designed and then apply the selected wiring topology to a segment layout of such circuit. Accordingly, the wiring router 25 can quickly generate a reliable wiring topology for a given circuit in a single pass without having to iterate using various trial and error techniques to select the desired wiring patterns and/or paths. Further, the predefined wiring patterns preferably ensure that each device segment is surrounded by the same localized wiring pattern thereby reducing the wiring topology's impact on tolerances. Indeed, using the techniques described herein, it is possible to generate common centroid circuit layouts.

Now, therefore, the following is claimed:

1. A system for designing integrated circuits, comprising:
   memory for storing data indicative of a circuit design for an integrated circuit, wherein the integrated circuit when manufactured in accordance with the circuit design has an arrangement of device segments defining a plurality of devices within the integrated circuit;
   a wiring router configured to generate a wiring topology for the circuit design and to route wire paths for the wiring topology based on the data such that wiring of the integrated circuit when manufactured in accordance with the circuit design and the wiring topology is fully matched to the arrangement of device segments such that a substantially similar localized metal pattern of the wiring surrounds each of the device segments thereby reducing wiring mismatches within the integrated circuit that cause mechanical stresses in the integrated circuit when the integrated circuit is manufactured in accordance with the circuit design and the wiring topology; and
   a display device configured to display information pertaining to the wiring topology.

2. The system of claim 1, wherein the wiring router is configured to reduce a redundancy of wires within the wiring topology based on a dimension of a segment array for the circuit design.

3. The system of claim 1, wherein the wiring topology has a repetitive pattern of wires within a plurality of wiring bays between the device segments, and wherein the wiring router is configured to select locations of vias for the wiring topology based on the data.

4. The system of claim 1, wherein the system further comprises design logic configured to generate the arrangement of device segments such that the devices have a common centroid.

5. The system of claim 4, wherein the design logic is configured to define a common centroid unit for the circuit design and to tile the common centroid unit in order to generate the arrangement of device segments.

6. The system of claim 1, wherein the data indicates a device type for the circuit design, wherein the wiring topology is predefined, wherein the wiring router is configured to select the predefined wiring topology for the circuit design based on the device type indicated by the data, and wherein the wiring router is configured to apply the selected wiring topology to the circuit design by adjusting the selected wiring topology based on at least one parameter of the circuit design defined by the data.

7. The system of claim 6, wherein the at least one parameter comprises a number of device segments in the circuit design.

8. The system of claim 7, wherein the wiring router is configured to select a number of wires for the wiring topology based on the number of device segments.

9. The system of claim 6, wherein the system further comprises design logic configured to generate the arrangement of device segments such that the devices have a common centroid.

10. The system of claim 1, wherein at least one of the devices is an active device.

11. The system of claim 1, wherein the wiring router is configured to deterministically route the wire paths based on the data.

12. The system of claim 1, wherein the wiring that is fully matched to the arrangement of segments has a plurality of wiring layers, wherein the data indicates a device type for the circuit design, and wherein each of the wiring layers has a respective predefined pattern that is selected by the wiring router based on the device type indicated by the data.

13. A system for designing integrated circuits, comprising:
memory for storing data indicative of an integrated circuit (IC) design having a segment arrangement defining a plurality of devices of the IC design, each of the devices having a plurality of device segments, the data indicative of a device type for the IC design;
a wiring router configured to select a predefined wiring topology for the IC design based on the device type and to apply the selected wiring topology to the IC design by automatically adjusting wiring paths of the selected wiring topology based on at least one parameter of the IC design defined by the data, wherein the wiring router is configured to ensure that wiring defined by the wiring topology is fully matched to each device segment of the devices thereby reducing mechanical stress variations in an IC manufactured in accordance with the IC design and having the predefined wiring topology; and
a display device configured to display information pertaining to the wiring topology.

14. The system of claim 13, wherein the at least one parameter comprises a number of device segments in the IC design.

15. The system of claim 14, wherein the wiring router is configured to select a number of wires for the wiring topology based on the number of device segments.

16. The system of claim 13, wherein at least one of the devices is an active device.

17. The system of claim 13, wherein the wiring defined by the wiring topology that is fully matched to each device segment of the devices has a plurality of layers.

18. A method for designing integrated circuits, comprising the steps of:
storing, in a memory device, data indicative of an integrated circuit (IC) design having a segment arrangement defining a plurality of devices, each of the devices having a plurality of device segments;
deterministically routing wire paths for a wiring topology for the IC design based on the data such that wiring defined by the wiring topology is fully matched to each device segment of the devices, wherein the wiring topology has a repetitive pattern of wires within a plurality of wiring bays between segments of the segment arrangement, and wherein the routing step comprises the step of selecting locations of vias for the wiring topology based on the data; and
displaying information pertaining to the wiring topology.

19. The method of claim 18, wherein the data indicates a device type for the IC design, wherein the wiring topology is predefined, and wherein the routing step comprises the steps of:
selecting the predefined wiring topology for the IC design based on the device type indicated by the data; and
applying the selected wiring topology to the IC design by adjusting the selected wiring topology based on at least one parameter of the IC design defined by the data.

20. The method of claim 18, further comprising the step of generating the segment arrangement such that devices defined by the segment arrangement have a common centroid, wherein the data is based on the generating the segment arrangement step.

21. The method of claim 20, wherein the generating the segment arrangement step comprises the steps of:
defining a common centroid unit for the IC design; and
tiling the common centroid unit.

22. The method of claim 18, wherein at least one of the devices is an active device.

23. A method for designing integrated circuits, comprising the steps of:
storing, in a memory device, data indicative of an integrated circuit (IC) design having a segment arrangement defining a plurality of devices, each of the devices having a plurality of device segments, the data indicative of a device type for the IC design;
selecting a predefined wiring topology for the IC design based on the device type indicated by the data;
applying the selected wiring topology to the IC design, wherein the applying step comprises the steps of automatically adjusting the selected wiring topology based on at least one parameter of the IC design defined by the data and ensuring that wiring defined by the wiring topology is fully matched to each device segment of the devices; and
displaying information pertaining to the wiring topology.

24. The method of claim 23, wherein the applying step comprises the step of selecting a number of wires for the wiring topology based on the at least one parameter.

25. The method of claim 23, wherein at least one of the devices is an active device.

26. The method of claim 23, wherein the wiring defined by the wiring topology that is fully matched to each device segment of the devices has a plurality of layers.

* * * * *